(12) United States Patent
Cho et al.

(10) Patent No.: US 9,387,552 B2
(45) Date of Patent: Jul. 12, 2016

(54) LASER ANNEALING APPARATUS AND LASER ANNEALING METHOD USING THE SAME

(71) Applicant: Samsung Display Co., Ltd., Yongin, Gyeonggi-Do (KR)

(72) Inventors: Joo Woan Cho, Seongnam-si (KR); Sanghoon Ahn, Seoul (KR); Byoungho Cheong, Yongin-si (KR); Byoung Kwon Choo, Hwaseong-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/697,444

(22) Filed: Apr. 27, 2015

(65) Prior Publication Data
US 2016/0020097 A1 Jan. 21, 2016

(30) Foreign Application Priority Data
Jul. 15, 2014 (KR) .................. 10-2014-0089056

(51) Int. Cl.
*H01L 21/02* (2006.01)
*G02B 27/14* (2006.01)
*G02B 26/08* (2006.01)
*B23K 26/06* (2014.01)
*B23K 26/067* (2006.01)
*C21D 9/50* (2006.01)
*H01L 21/268* (2006.01)

(52) U.S. Cl.
CPC ........... *B23K 26/062* (2015.10); *B23K 26/0604* (2013.01); *B23K 26/0643* (2013.01); *B23K 26/0665* (2013.01); *B23K 26/0676* (2013.01); *B23K 26/082* (2015.10); *B23K 26/352* (2015.10); *C21D 9/50* (2013.01); *G02B 26/08* (2013.01); *G02B 27/145* (2013.01); *H01L 21/268* (2013.01); *B23K 2201/40* (2013.01)

(58) Field of Classification Search
CPC .... H01S 3/005; H01L 27/1285; H01L 21/268
See application file for complete search history.

(56) References Cited

U.S. PATENT DOCUMENTS

| | | | | |
|---|---|---|---|---|
| 6,426,245 B1 * | 7/2002 | Kawasaki | ............... | H01L 27/12 257/E27.111 |
| 7,301,981 B2 | 11/2007 | Sun et al. | | |
| 7,630,424 B2 * | 12/2009 | Ershov | ............... | G03F 7/70025 372/55 |
| 7,822,092 B2 * | 10/2010 | Ershov | ............... | G03F 7/70583 372/55 |
| 7,885,309 B2 * | 2/2011 | Ershov | .................... | H01S 3/225 372/57 |
| 7,999,915 B2 * | 8/2011 | Ershov | ............... | G03F 7/70025 355/53 |
| 8,767,782 B2 * | 7/2014 | Tanaka | ................. | B23K 26/067 219/121.6 |
| 2005/0270650 A1 * | 12/2005 | Tsukihara | .......... | B23K 26/0604 359/618 |
| 2009/0122825 A1 * | 5/2009 | Ershov | ............... | G03F 7/70583 372/57 |
| 2009/0127477 A1 * | 5/2009 | Tanaka | ............... | B23K 26/0738 250/492.22 |

(Continued)

FOREIGN PATENT DOCUMENTS

KR 10-0825701 B1 4/2008
KR 10-2013-0006045 A 1/2013

*Primary Examiner* — Jaehwan Oh
(74) *Attorney, Agent, or Firm* — Knobbe Martens Olson & Bear LLP

(57) ABSTRACT

A laser annealing apparatus includes a beam splitter that splits a laser beam emitted from a laser source into a reflection light beam and a transmission light beam, a beam vibrator that makes an irradiation point of the reflection light beam or the transmission light beam vibrate in a predetermined direction, a beam inverter that inverts the reflection light beam or the transmission light beam, and a light collector that collects the reflection light and the transmission light.

20 Claims, 3 Drawing Sheets

(56) References Cited

U.S. PATENT DOCUMENTS

2013/0140288 A1 6/2013 Yu et al.
2013/0215925 A1 8/2013 Kaster et al.
2013/0222790 A1 8/2013 Hirao

* cited by examiner

LASER ANNEALING APPARATUS AND LASER ANNEALING METHOD USING THE SAME

CROSS-REFERENCE TO RELATED APPLICATION

This U.S. non-provisional patent application claims priority under 35 U.S.C. §119 of Korean Patent Application No. 10-2014-0089056, filed on Jul. 15, 2014, the contents of which are hereby incorporated by reference in its entirety.

BACKGROUND

1. Field of Disclosure

The present disclosure relates to a laser annealing apparatus and a laser annealing method using the same.

2. Description of the Related Art

A flat panel display device, such as a liquid crystal display device, an organic light emitting display device, etc., includes a thin film transistor to drive a pixel. The thin film transistor includes a semiconductor active layer doped with an impurity at a high concentration, and amorphous silicon or polycrystalline silicon is used for the semiconductor active layer.

The thin film transistor including the amorphous silicon has been used since it is able to be deposited with low temperature, but has disadvantages such as deterioration in reliability of electrical characteristics, difficulty in large-size display device, etc. Accordingly, in recent years, the thin film transistor including the polycrystalline silicon is widely used.

The polycrystalline silicon has a current mobility of tens to hundreds $cm^2/Vs$, high frequency operational characteristics, and low current leakage, and thus the polycrystalline silicon is appropriate for a large-size flat panel display device. The polycrystalline silicon is fabricated by crystallizing the amorphous silicon through a laser annealing method performed by irradiating a laser beam on a thin film substrate.

SUMMARY

The present disclosure provides a laser annealing apparatus capable of reducing energy dispersion of a laser beam.

The present disclosure provides a laser annealing method using the laser annealing apparatus.

One aspect of the invention provides a laser annealing apparatus comprising an optical system which comprises: a first beam splitter configured to split a laser beam emitted from a laser source into a reflection light beam and a transmission light beam; a second beam splitter configured to split the reflection light beam into a first split beam and a second split beam; a third beam splitter configured to split the transmission light beam into a third split beam and a fourth split beam; a first beam vibrator configured to move the first split beam's path to cause vibrational movement of an irradiation point of the first split beam in a predetermined plane; a first beam inverter configured to invert the second split beam; a second beam vibrator configured to move the fourth split beam's path to cause vibrational movement of an irradiation point of the fourth split beam in a predetermined plane; a second beam inverter configured to invert the fourth split beam; and a beam collector configured to collect the first, second, third, and fourth split beams to provide an output laser beam to be irradiated to a surface subject to laser annealing.

Another aspect of the invention provides a method of making a display device panel comprising a thin film transistor, the method comprising: providing the foregoing laser annealing apparatus providing a substrate and an amorphous semiconductor layer formed over the substrate; entering a laser beam emitted from a laser source into the optical system such that the optical system provides the output laser beam; and irradiating the output laser beam to the amorphous semiconductor layer to change the amorphous semiconductor layer to polycrystalline semiconductor layer for forming a thin film transistor.

Still another aspect of the invention provides a laser annealing apparatus comprising an optical system which comprises: a beam splitter configured to split a laser beam emitted from a laser source into a reflection light beam and a transmission light beam; a beam vibrator configured to move the reflection light beam's path or the transmission light beam's path to cause vibrational movement of an irradiation point of the reflection light beam or the transmission light beam in a predetermined plane; a beam inverter configured to invert either the reflection light beam or the transmission light beam; and a light collector that collects the reflection light beam and the transmission light beam to provide an output laser beam to be irradiated to a surface subject to laser annealing.

A further aspect of the invention provides a laser annealing method comprising: splitting a laser beam emitted from a laser source into a transmission light beam transmitting through a first beam splitter and a reflection light beam reflected by the first beam splitter; splitting the reflection light beam into a first split beam transmitting through a second beam splitter and a second split beam reflected by the second beam splitter; moving the first split beam's path thereby causing vibrational movement of an irradiation point of the first split beam in a predetermined plane using a first beam vibrator; inverting the second split beam using a first beam inverter; splitting the transmission light beam into a third split beam transmitting through a third beam splitter and a fourth split beam reflected by the third beam splitter; moving the fourth split beam's path thereby causing vibrational movement of an irradiation point of the fourth split beam in a predetermined plane using a second beam vibrator; inverting the fourth split beam exiting from the second beam vibrator using a second beam inverter; and collecting the first, second, third, and fourth split beams to provide an output laser beam to be irradiated to a surface subject to laser annealing. The foregoing method may further comprise providing a substrate and an amorphous semiconductor layer formed over the substrate; and irradiating the output laser beam to the amorphous semiconductor layer thereby changing the amorphous semiconductor layer to polycrystalline semiconductor layer.

Embodiments of the inventive concept provide a laser annealing apparatus including a laser provided in at least one or more, a first beam splitter, a second beam splitter, a third beam splitter, a first beam vibrator, a second beam vibrator, a first beam inverter, a second beam inverter, and a light collector.

The first beam splitter splits a laser beam emitted from a laser source into a reflection light beam and a transmission light beam. The second beam splitter splits the reflection light beam into a first split beam and a second split beam. The third beam splitter splits the transmission light into a third split beam and a fourth split beam. In this case, a light amount ratio of the first, second, third, and fourth split beams is 1:1:1:1.

The first beam vibrator makes an irradiation point of the first split beam vibrate back and forth in a predetermined direction. The second beam vibrator makes an irradiation point of the fourth split beam vibrate back and forth in a predetermined direction. The first beam inverter inverts the second split beam and the second beam inverter inverts the fourth split beam.

Each of the first and second beam inverters includes first, second, third, and fourth mirror surfaces. The first mirror surface faces the second mirror surface and the third mirror surface faces the fourth mirror surface. The second mirror surface is disposed to form a right angle together with the third mirror surface. The second and third mirror surfaces are disposed above and spaced apart from the first and fourth mirror surfaces, respectively.

The collector collects the first, second, third, and fourth split beams. The second split beam has a shape inverted in up and down and left and right directions with respect to the third split beam. The first split beam has a shape inverted in up and down and left and right directions with respect to the fourth split beam. The laser annealing apparatus further includes a reflector to change a path of the laser beam.

Thus, the first to fourth split beams having different shapes are overlapped with each other, and thus the laser beam exiting from the laser annealing apparatus has the uniform energy distribution.

Embodiments of the inventive concept provide a laser annealing method including splitting a laser beam emitted from a laser source into a transmission light transmitting through a first beam splitter and a reflection light beam reflected by the first beam splitter, splitting the reflection light beam into a first split beam transmitting through a second beam splitter and a second split beam reflected by the second beam splitter, making an irradiation point of the first split beam vibrate in a predetermined direction using a first beam vibrator, inverting the second split beam using a first beam inverter, splitting the transmission light into a third split beam transmitting through a third beam splitter and a fourth split beam reflected by the third beam splitter, making an irradiation point of the fourth split beam vibrate in a predetermined direction using a second beam vibrator, inverting the fourth split beam exiting from the second beam vibrator using a second beam inverter, and collecting the first, second, third, and fourth split beams.

Each of the first and second beam inverters includes first, second, third, and fourth mirror surfaces.

The inverting of the second split beam includes reflecting the second split beam incident to the first mirror surface of the first beam inverter to the second mirror surface of the first beam inverter, reflecting the second split beam incident to the second mirror surface of the first beam inverter to the third mirror surface of the first beam inverter, and reflecting the second split beam incident to the third mirror surface of the first beam inverter to the fourth mirror surface of the first beam inverter.

The inverting of the fourth split beam includes reflecting the fourth split beam incident to the first mirror surface of the second beam inverter to the second mirror surface of the second beam inverter, reflecting the fourth split beam incident to the second mirror surface of the second beam inverter to the third mirror surface of the second beam inverter, and reflecting the fourth split beam incident to the third mirror surface of the second beam inverter to the fourth mirror surface of the second beam inverter.

According to the above, the thin film transistor, which is manufactured by the laser annealing apparatus and the laser annealing method using the laser annealing apparatus, may have improved reliability.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
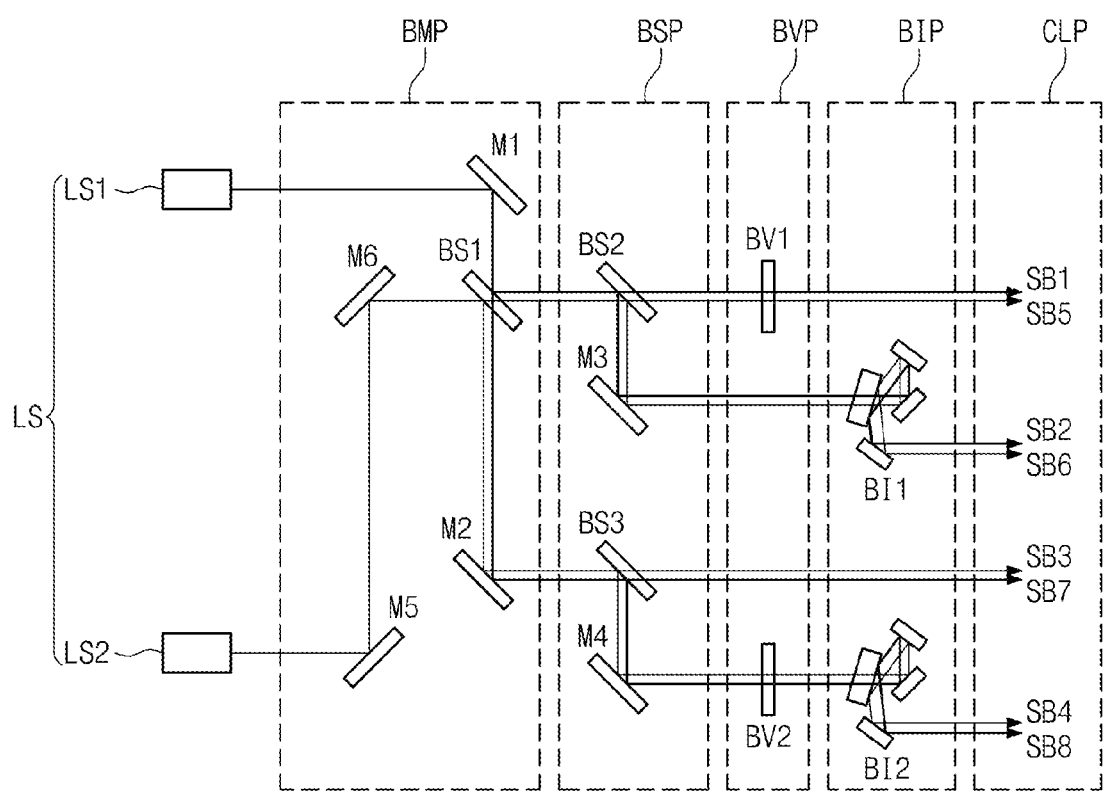
FIG. 1 is a view showing a laser annealing apparatus according to an embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

Figure 2:
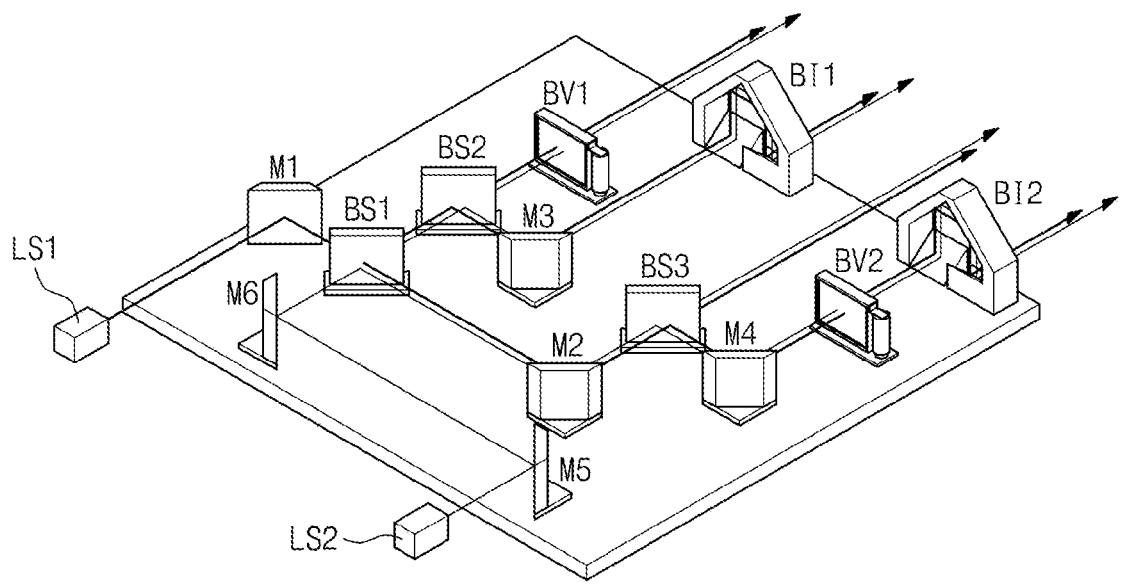
FIG. 2 is a perspective view showing the laser annealing apparatus shown in FIG. 1.

FIG. 1 is a view showing a laser annealing apparatus according to an embodiment of the present disclosure and FIG. 2 is a perspective view showing the laser annealing apparatus shown in FIG. 1.

Referring to FIGS. 1 and 2, the laser annealing apparatus includes an optical system which splits a laser beam into a plurality of lights and collects the lights to one light.

The laser annealing apparatus includes a laser source LS, a beam mixer BMP, a beam splitter BSP, a beam vibrator BVP, a beam inverter BIP, and a light collector CLP.

The laser source LS generates the laser beam. The laser source LS is provided in a plural number. The laser source LS may be, but not limited to, an excimer laser.

When the laser LS is provided in plural number, the laser beams are mixed with each other by the beam mixer BMP. In the beam mixer BMP, the laser beams are mixed with each other to generate two laser beams.

The beam mixer BMP includes a first beam splitter BS1, a first reflector M1, and a second reflector M2.

The first beam splitter BS1 reflects a portion of the laser beam on the basis of a reflectivity thereof and transmits the other portion of the laser beam to split the laser beam into two beams, i.e., a first beam and a second beam.

The first reflector M1 changes a path in which the laser beam travels. The first reflector M1 is disposed between the laser source LS and the first beam splitter BS1 and reflects the laser beam emitted from the laser source LS toward the first beam splitter BS1.

However, the first reflector M1 may be omitted as long as the laser beam may be directly incident to the first beam splitter BS1. In addition, the first reflector M1 may be provided in a plural number and the first reflectors M1 may be disposed between the laser source LS and the first beam splitter BS1. In this case, the first reflectors M1 reflect the laser beam several times to allow the laser beam to travel to the first beam splitter BS1.

The second reflector M2 reflects the laser beam exiting through the first beam splitter BS1.

The beam splitter BSP splits the first beam into two beams and the second beam into two beams.

The beam splitter BSP includes a second beam splitter BS2, a third beam splitter BS3, a third reflector M3, and a fourth reflector M4.

The second beam splitter BS2 reflects a portion of the first beam on the basis of a reflectivity thereof and transmits the other portion of the first beam to split the first beam into a first split beam and a second split beam.

The third reflector M3 reflects the first beam reflected by the second beam splitter BS2.

The third beam splitter BS3 reflects a portion of the second beam and transmits the other portion of the second beam to split the second beam into a third split beam and a fourth split beam.

The fourth reflector M4 reflects the second beam reflected by the third beam splitter BS3.

The beam vibrator BVP makes an irradiation point of a portion of the first to fourth split beams back and forth along a predetermined direction. In embodiments, the beam vibrator BVP can move the split beam's path such that the split beam's irradiating point oscillates on a predetermined plane. In such embodiments, the beam vibrator BVP includes an oscillating optical device which is placed in the split beam's path and oscillates such that the split beam's irradiating point oscillates on a predetermined plane. Further, the beam vibrator BVP further includes a shaker which shakes the optical device.

The beam vibrator BVP includes a first beam vibrator BV1 and a second beam vibrator BV2.

Each of the first and second beam vibrators BV1 and BV2 includes a vibration driving device generating a back-and-forth vibration or oscillation at a predetermined frequency, an optical device vibrating back and forth by the vibration driving device, and a snubber preventing vibrations from being transmitted to other elements except for the first and second beam vibrators BV1 and BV2. The vibration driving device may be realized by a motor.

The optical device may be a lens, slit, or reflector. The optical device refracts, diffracts, or reflects the split beam incident thereto. When the optical device vibrates back and forth by the vibration driving device or shaker, a point at the split beam is refracted, diffracted, or reflected in the optical device is changed. Accordingly, a time and space difference occurs between the irradiation points of the split beams exiting from the first and second beam vibrators BV1 and BV2.

Figure 3:
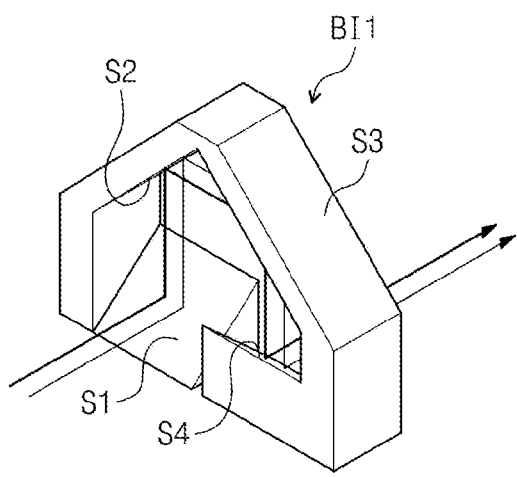
FIG. 3 is a perspective view showing a beam inverter according to an embodiment of the present disclosure.

FIG. 3 is a perspective view showing the beam inverter BIP according to an embodiment of the present disclosure.

The beam inverter BIP inverts a portion of the first to fourth split beams. The beam inverter BIP includes a first beam inverter BI1 and a second beam inverter BI2.

Hereinafter, the first and second beam inverters BI1 and BI2 will be described with reference to FIG. 3. In the present embodiment, the first and second beam inverters BI1 and BI2 have the same structure and function, and thus, for the convenience of explanation, only the first beam inverter BI1 will be described in detail.

As shown in FIG. 3, the first beam inverter BI1 includes four mirror surfaces, e.g., first, second, third, and fourth mirror surfaces S1, S2, S3, and S4.

The first mirror surface S1 reflects the split beam exiting from the beam vibrator BVP or the beam splitter BSP to the second mirror surface S2 facing the first mirror surface S1. The first mirror surface S1 is disposed on a ground plane and inclined at a predetermined angle with respect to the ground plane to face the beam splitter BSP or the beam vibrator BVP.

The second mirror surface S2 reflects the split beam reflected by the first mirror surface S1 to the third mirror surface S3 disposed adjacent to the second mirror surface S2.

The second mirror surface S2 is disposed above the first mirror surface S1 and spaced apart from the first mirror surface S1 by a predetermined distance. One side of the second mirror surface S2 is disposed adjacent to one surface of the third mirror surface S3 such that the second mirror surface S2 forms a right angle with the third mirror surface S3. Therefore, the split beam incident to the second mirror surface S2 and the split beam incident to the third mirror surface S3 are symmetrical with each other with respect to a line at which the one side of the second mirror surface S2 meets with the one side of the third mirror surface S3.

The third mirror surface S3 reflects the split beam reflected by the second mirror surface S2 to the fourth mirror surface S4.

The fourth mirror surface S4 reflects the split beam reflected by the third mirror surface S3 to the light collector CLP.

The fourth mirror surface S4 is disposed under the third mirror surface S3 and spaced apart from the third mirror surface S3 by a predetermined distance. The fourth mirror surface S4 is inclined at a predetermined angle with respect to the ground plane to face the light collector CLP.

Thus, the split beam incident to the first beam inverter BI1 is sequentially reflected by the first to fourth mirror surfaces S1 to S4 and inverted in up and down and left and right directions.

Referring to FIGS. 1 and 2 again, the split beams respectively exiting from the beam splitter BSP, the beam vibrator BVP, and the beam inverter BIP are overlapped with each other by the light collector CLP.

Hereinafter, a path in which the laser beam emitted from the laser source LS travels in the laser annealing apparatus will be described in detail with reference to FIGS. 1 to 4.

In the present embodiment, two lasers, i.e., a first laser source LS1 and a second laser source LS2, will be described as a representative example.

For the convenience of explanation, the path in which a first laser beam emitted from the first laser source LS1 travels will be described, and then the path in which a second laser beam emitted from the second laser source LS2 travels will be described.

The first laser beam is incident to the beam mixer BMP and exits after passing through the beam splitter BSP, the beam vibrator BVP, the beam inverter BIP, and the light collector CLP.

The first laser beam is totally reflected by the first reflector M1 and incident to the first beam splitter BS1.

The first laser beam incident to the first beam splitter BS1 is split into a first reflection light beam reflected by the first beam splitter BS1 and a first transmission light beam transmitting through the first beam splitter BS1.

In the present embodiment, the first laser beam is split such that a light amount ratio of the first reflection light beam to the first transmission light beam is 1:1, but the light amount ratio of the first reflection light beam and the first transmission light beam varies depending on the reflectivity of the first beam splitter BS1.

The first reflection light beam is incident to the second beam splitter BS2. The first reflection light beam incident to the second beam splitter BS2 is split into a first split beam SB1 transmitting through the second beam splitter BS2 and a second split beam BS2 reflected by the second beam splitter BS2. The first reflection light beam is split into the first and second split beams SB1 and SB2 such that a light amount ratio of the first split beam SB1 to the second split beam SB2 is 1:1, but the light amount ratio of the first split beam SB1 to the second split beam SB2 should not be limited thereto or thereby. That is, the light amount ratio of the first split beam SB1 to the second split beam SB2 varies depending on the reflectivity of the second beam splitter BS2.

The first split beam SB1 is incident to the first beam vibrator BV1. The first split beam SB1 exiting from the first beam vibrator BV1 is incident to the light collector CLP and the irradiation point of the first split beam SB1 vibrates back and forth along a predetermined direction.

The second split beam SB2 is totally reflected by the third reflector M3 and incident to the first beam inverter BI1. The second split beam SB2 is sequentially reflected by the first to fourth mirror surfaces S1 to S4 of the first beam inverter BI1, and then incident to the light collector CLP. In this case, the second split beam SB2 is incident to the light collector CLP after being inverted in up and down and left and right directions with respect to a cross-section of the second split beam SB2 incident to the first mirror surface S1.

The first transmission light beam is totally reflected by the second mirror surface M2 and incident to the third beam splitter BS3. The first transmission light beam incident to the third beam splitter BS3 is split into a third split beam SB3 transmitting through the third beam splitter BS3 and a fourth split beam SB4 reflected by the third beam splitter BS3. The first transmission light beam is split into the third and fourth split beams SB3 and SB4 such that a light amount ratio of the third split beam SB3 to the fourth split beam SB4 is 1:1. However, the light amount ratio of the third split beam SB3 to the fourth split beam SB4 varies depending on the reflectivity of the third beam splitter BS3.

The third split beam SB3 is incident to the light collector CLP. The third split beam SB3 incident to the light collector CLP is inverted in up and down and left and right directions with respect to the second split beam SB2 incident to the light collector CLP.

The fourth split beam SB4 is totally reflected by the fourth reflector M4 and incident to the second beam vibrator BV2. The fourth split beam SB4 exiting from the second beam vibrator BV2 is incident to the second beam splitter BI2 and an irradiation point of the fourth split beam SB4 vibrates back and forth along a predetermined direction.

The fourth split beam SB4 incident to the second beam splitter BI2 is sequentially reflected by the first to fourth reflector S1 to S4 of the second beam splitter BI2, and then incident to the light collector CLP. In this case, the fourth split beam SB4 is incident to the light collector CLP after being inverted in up and down and left and right directions with respect to a cross-section of the fourth split beam SB incident to the first reflector S1 of the second beam inverter BI2.

The fourth split beam SB4 incident to the light collector CLP is inverted in up and down and left and right directions with respect to the first split beam SB1 incident to the light collector CLP.

The first to fourth split beams SB1 to SB4 are overlapped with each other by the light collector CLP, and then exit from the laser annealing apparatus.

In the present embodiment, positions of elements included in the laser annealing apparatus may be changed as long as the first to fourth split beams SB1 to SB4 incident to the light collector CLP may have different shapes.

In the present embodiment, the second laser beam is incident to the beam mixer BMP and exits after passing through the beam splitter BSP, the beam vibrator BVP, the beam inverter BIP, and the light collector CLP. For the convenience of explanation, detailed descriptions of the same paths of the second laser beam as those of the first laser beam will be described.

The second laser beam incident to the beam mixer BMP is totally reflected by fifth and sixth reflectors M5 and M6 and incident to the first beam splitter BS1. The second laser beam may be mixed with the first laser beam incident to the first beam splitter BS1 when the second laser beam is incident to the first beam splitter BS1.

As similar to the first reflector M1, the fifth and sixth reflectors M5 and M6 are disposed between the second laser source LS2 and the first beam splitter BS1 to change the path of the second laser beam.

The second laser beam incident to the first beam splitter BS1 travels in the same way as that of the first laser beam incident to the first beam splitter BS1, and thus fifth to eighth split beams SB5 to SB8 having different shapes are generated.

The fifth to eighth split beams SB5 to SB8 are respectively overlapped with the first to fourth split beams SB1 to SB4 by the light collector CLP, and then exit from the laser annealing apparatus.

In the present embodiment, positions of elements included in the laser annealing apparatus may be changed as long as the fifth to eighth split beams SB5 to SB8 incident to the light collector CLP may have the different shapes from each other.

Figure 4:
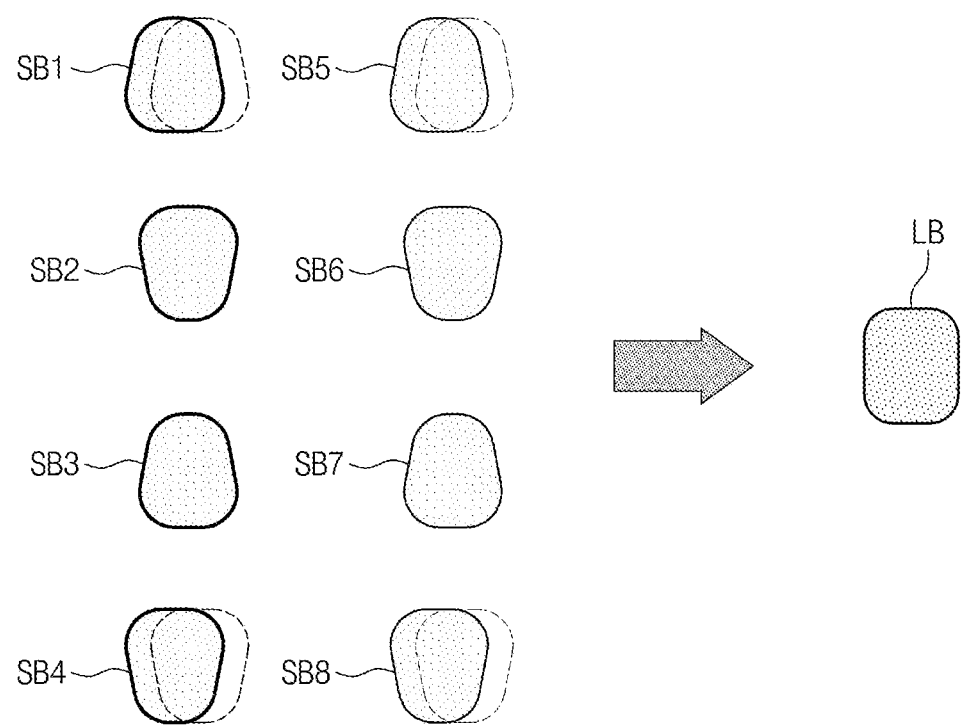
FIG. 4 is a view showing shapes of split beams and overlap shapes of the split beams according to an embodiment of the present disclosure.

FIG. 4 is a view showing shapes of the split beams and the overlap shapes of the split beams according to an embodiment of the present disclosure.

FIG. 4 shows the shapes of the first to eight beams SB1 to SB8 incident to the light collector CLP, which are generated from the first and second laser beams passing through the beam mixer BMP, the beam splitter BSP, the beam vibrator BVP, and the beam inverter BIP and the shapes of the last laser beam LB obtained by overlapping the first to eight split beams SB1 to SB8 with each other.

The third split beam SB3 has a shape distorted from the shape of the first laser beam.

The first split beam SB1 has the same shape as that of the third split beam SB3 and the irradiation point of the first split beam SB1 vibrates back and forth, e.g., in left-and-right direction.

The second split beam SB2 has a shape inverted in up and down and left and right directions with respect to the shape of the third split beam SB3.

The fourth split beam SB4 has a shape inverted in up and down and left and right directions with respect to the shape of the third split beam SB3 and the irradiation point of the fourth split beam SB4 vibrates back and forth, e.g., in left-and-right direction.

The seventh split beam SB7 has a shape distorted from the shape of the second laser beam.

The fifth split beam SB5 has the same shape as that of the seventh split beam SB7 and the irradiation point of the fifth split beam SB5 vibrates back and forth, e.g., in left-and-right direction.

The sixth split beam SB6 has a shape inverted in up and down and left and right directions with respect to the shape of the seventh split beam SB7.

The eight split beam SB8 has a shape inverted in up and down and left and right directions with respect to the shape of the seventh split beam SB7 and the irradiation point of the eighth split beam SB8 vibrates back and forth, e.g., in left-and-right direction.

Finally, the first to fourth split beams SB1 to SB4 are respectively overlapped with the fifth to eighth split beams SB5 to SB8, and thus the laser beam having uniform energy density is generated.

According to a conventional laser annealing apparatus, the shape of the laser beam is distorted while passing through the laser annealing apparatus and the energy dispersion of the laser beam increases. However, according to the laser annealing apparatus according to the present embodiment, the four laser beams split from one laser beam have the different shapes while passing through the beam vibrator and the beam inverter and are overlapped with each other to generate one laser beam. Accordingly, the four laser beams are overlapped with each other to compensate for the distorted portions thereof.

That is, when the inverted split beam is overlapped with other split beams, the energy density in an upper portion of the laser beam and the energy density in a lower portion of the laser beam are compensated for each other. In addition, when the split beam, in which the irradiation point vibrates back and forth along the predetermined direction, is overlapped with other split beams, the energy density in a left portion of the laser beams and the energy density in a right portion of the laser beams may be compensated for each other. Therefore, the laser beam exiting from the laser annealing apparatus may have the uniform energy density.

The laser beams are interfered with each other while the laser beam is split into the plural split beams and the split beams are overlapped with each other, and thus the intensity of the laser beam exiting from the laser annealing apparatus becomes stronger.

Thus, although the number of irradiating the laser beam on a substrate increases when the thin film transistor is manufactured using the laser beam exiting from the laser annealing apparatus, the thin film transistor may be prevented from being damaged due to the laser beam since the laser beam has the uniform energy distribution. For instance, when the laser beam having the uniform energy density is irradiated on the amorphous silicon, the polycrystalline silicon may be uniformly formed. As a result, the thin film transistor may have improved reliability.

Although embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A laser annealing apparatus comprising an optical system which comprises:
   a first beam splitter configured to split a laser beam emitted from a laser source into a reflection light beam and a transmission light beam;
   a second beam splitter configured to split the reflection light beam into a first split beam and a second split beam;
   a third beam splitter configured to split the transmission light beam into a third split beam and a fourth split beam;
   a first beam vibrator configured to move the first split beam's path to cause vibrational movement of an irradiation point of the first split beam in a predetermined plane;
   a first beam inverter configured to invert the second split beam;
   a second beam vibrator configured to move the fourth split beam's path to cause vibrational movement of an irradiation point of the fourth split beam in a predetermined plane;
   a second beam inverter configured to invert the fourth split beam; and
   a beam collector configured to collect the first, second, third, and fourth split beams to provide an output laser beam to be irradiated to a surface subject to laser annealing.

2. The laser annealing apparatus of claim 1, wherein a light amount ratio of the first, second, third, and fourth split beams is 1:1:1:1.

3. The laser annealing apparatus of claim 1, wherein each of the first and second beam inverters comprises first, second, third, and fourth mirror surfaces.

4. The laser annealing apparatus of claim 3, wherein the first mirror surface faces the second mirror surface and the third mirror surface faces the fourth mirror surface.

5. The laser annealing apparatus of claim 4, wherein the second mirror surface is disposed to form a right angle with respect to the third mirror surface.

6. The laser annealing apparatus of claim 5, wherein the second split beam has a shape inverted in a vertical direction and a horizontal direction with respect to the third split beam.

7. The laser annealing apparatus of claim 6, wherein the first split beam has a shape inverted in a vertical direction and a horizontal direction with respect to the fourth split beam.

8. The laser annealing apparatus of claim 1, further comprising a beam reflector to change a path of the laser beam.

9. The laser annealing apparatus of claim 1, further comprising one or more laser sources configured to emit the laser beam.

10. A laser annealing apparatus comprising an optical system which comprises:
   a beam splitter configured to split a laser beam emitted from a laser source into a reflection light beam and a transmission light beam;
   a beam vibrator configured to move the reflection light beam's path or the transmission light beam's path to cause vibrational movement of an irradiation point of the reflection light beam or the transmission light beam in a predetermined plane;
   a beam inverter configured to invert either the reflection light beam or the transmission light beam; and
   a light collector that collects the reflection light beam and the transmission light beam to provide an output laser beam to be irradiated to a surface subject to laser annealing.

11. The laser annealing apparatus of claim 10, wherein the beam splitter is configured to split the laser beam such that a light amount ratio of the reflection light beam to the transmission light beam is 1:1.

12. The laser annealing apparatus of claim 10, wherein the beam inverter is configured to invert the light beam in a vertical direction and a horizontal direction.

13. The laser annealing apparatus of claim 12, wherein the beam inverter comprises four mirror surfaces.

14. A laser annealing method comprising:
   splitting a laser beam emitted from a laser source into a transmission light beam transmitting through a first beam splitter and a reflection light beam reflected by the first beam splitter;
   splitting the reflection light beam into a first split beam transmitting through a second beam splitter and a second split beam reflected by the second beam splitter;
   moving the first split beam's path thereby causing vibrational movement of an irradiation point of the first split beam in a predetermined plane using a first beam vibrator;
   inverting the second split beam using a first beam inverter;
   splitting the transmission light beam into a third split beam transmitting through a third beam splitter and a fourth split beam reflected by the third beam splitter;
   moving the fourth split beam's path thereby causing vibrational movement of an irradiation point of the fourth split beam in a predetermined plane using a second beam vibrator;
   inverting the fourth split beam exiting from the second beam vibrator using a second beam inverter; and
   collecting the first, second, third, and fourth split beams thereby providing an output laser beam to be irradiated to a surface subject to laser annealing.

15. The method of claim 14, wherein each of the first and second beam inverters comprises first, second, third, and fourth mirror surfaces.

16. The method of claim 15, wherein the inverting of the second split beam comprises:
   reflecting the second split beam incident to the first mirror surface of the first beam inverter to the second mirror surface of the first beam inverter;
   reflecting the second split beam incident to the second mirror surface of the first beam inverter to the third mirror surface of the first beam inverter; and
   reflecting the second split beam incident to the third mirror surface of the first beam inverter to the fourth mirror surface of the first beam inverter.

17. The method of claim 15, wherein the inverting of the fourth split beam comprises:
   reflecting the fourth split beam incident to the first mirror surface of the second beam inverter to the second mirror surface of the second beam inverter;
   reflecting the fourth split beam incident to the second mirror surface of the second beam inverter to the third mirror surface of the second beam inverter; and
   reflecting the fourth split beam incident to the third mirror surface of the second beam inverter to the fourth mirror surface of the second beam inverter.

18. The method of claim 15, further comprising:
   providing a substrate and an amorphous semiconductor layer formed over the substrate; and
   irradiating the output laser beam to the amorphous semiconductor layer thereby changing the amorphous semiconductor layer to polycrystalline semiconductor layer.

19. A method of making a display device panel comprising a thin film transistor, the method comprising:
   providing the laser annealing apparatus of claim 1;
   providing a substrate and an amorphous semiconductor layer formed over the substrate;
   entering a laser beam emitted from a laser source into the optical system such that the optical system provides the output laser beam; and
   irradiating the output laser beam to the amorphous semiconductor layer to change the amorphous semiconductor layer to polycrystalline semiconductor layer for forming a thin film transistor.

20. The method of claim 19, wherein each of the first and second beam inverters comprises first, second, third, and fourth mirror surfaces.

* * * * *